US009553062B1

United States Patent
Fan et al.

(10) Patent No.: US 9,553,062 B1
(45) Date of Patent: Jan. 24, 2017

(54) FINGERPRINT IDENTIFICATION DEVICE

(71) Applicant: J-METRICS TECHNOLOGY Co., Ltd., Taipei (TW)

(72) Inventors: Chen-Chih Fan, Taipei (TW); Wei-Ting Lin, Taipei (TW); Shih-Chun Kuo, Taipei (TW)

(73) Assignee: J-METRICS TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 15/059,920

(22) Filed: Mar. 3, 2016

(30) Foreign Application Priority Data

Dec. 28, 2015 (TW) .............................. 104220963 U

(51) Int. Cl.
H01L 27/14 (2006.01)
H01L 29/82 (2006.01)
H01L 29/84 (2006.01)
H01L 23/00 (2006.01)
G06K 9/00 (2006.01)

(52) U.S. Cl.
CPC ............. *H01L 24/08* (2013.01); *G06K 9/0002* (2013.01); *H01L 2224/02372* (2013.01)

(58) Field of Classification Search
CPC .................. H01L 24/08; G06K 9/0002
USPC ....................................................... 257/414
See application file for complete search history.

(56) References Cited

U.S. PATENT DOCUMENTS

| 2014/0369573 | A1* | 12/2014 | Chiu | G06K 9/00013 |
| | | | | 382/124 |
| 2016/0171273 | A1* | 6/2016 | Ho | G06K 9/0002 |
| | | | | 324/658 |
| 2016/0239699 | A1* | 8/2016 | Chang | G06K 9/0002 |
| 2016/0266680 | A1* | 9/2016 | Chang | G06F 3/044 |

* cited by examiner

*Primary Examiner* — David S Blum
(74) *Attorney, Agent, or Firm* — Andrew M Calderon; Roberts Mlotkowski Safran Cole & Calderon, P.C.

(57) ABSTRACT

A fingerprint identification device includes a first dielectric layer, a fingerprint sensing chip, a packaging layer, a first redistribution layer, a second dielectric layer, a second redistribution layer, and a third dielectric layer. The fingerprint sensing chip is disposed on the first dielectric layer and has a sensing transmission pad. The packaging layer defines a first via hole and covers the first dielectric layer and fingerprint sensing chip. Disposed on the packaging layer, the first redistribution layer contacts a drive transmission pad via the first via hole. The second dielectric layer defines a second via hole and covers the packaging layer and the first redistribution layer. Disposed on the second dielectric layer, the second redistribution layer defines a looped pattern, in addition to connect electrically with the first redistribution layer via the second via hole. The third dielectric layer covers the second dielectric layer and second redistribution layer.

17 Claims, 3 Drawing Sheets

FINGERPRINT IDENTIFICATION DEVICE

CROSS-REFERENCES TO RELATED APPLICATIONS

This non-provisional application claims priority under 35 U.S.C. §119(a) on Patent Application No. 104220963 filed in Taiwan, R.O.C. on Dec. 28, 2015, the entire contents of which are hereby incorporated by reference.

BACKGROUND

Technical Field

The instant disclosure relates to a fingerprint identification device and manufacturing method thereof, in particular a fingerprint identification device utilizing the wafer level package (WLP) technique.

Related Art

With the continuous advancement of technology, biometric identification schemes such as fingerprint, voiceprint, iris, and retina are gradually being applied widely to personal identification and authentication. Since fingerprint characteristic information requires less memory space relative to other biological characteristic information, and based on the combined consideration of biological characteristic information with regards to user friendliness, security, and identification efficiency, fingerprint identification has become the mainstream method of biological identification technology. Consequently, many products in the market such as laptop computers, tablet computers, and mobile phones, are equipped with fingerprint identification capability to enhance user security.

To date, capacitive fingerprint identification may be categorized into active and passive types. With the active capacitive fingerprint identification technique, fingerprint identification devices utilize standalone metal rings for contacting the user's fingers, such that the fingers export pulse wave signals. The pulse wave signals are received by the finger touching area, and identified to obtain the fingerprint information. However, after each fingerprint identification device has been made, these metal rings for the known active capacitive fingerprint identification devices must be individually recessed into the fingerprint identification device, which makes the overall manufacturing process more complex and increases the manufacturing cost.

With the passive capacitive fingerprint identification technique, fingerprint information is obtained via parasitic capacitance of each sensing element in a fingerprint sensing chip and difference in electrical charge of the sensing capacitance formed between the user's fingers. However, since sensing elements with a large area are required for the known passive capacitive fingerprint identification chip, the chip itself takes up a large area that also increases the manufacturing cost.

Consequently, how to simplify the manufacturing process of fingerprint identification devices and lower its manufacturing cost are important issues to consider for persons having ordinary skill in the art.

SUMMARY

To address this issue, one embodiment of the instant disclosure provides a fingerprint identification device, which comprises a first dielectric layer, a fingerprint sensing chip, a packaging layer, a first redistribution layer, a second dielectric layer, a second redistribution layer, and a third dielectric layer. The first dielectric layer has a first surface and a second surface opposite thereto. The fingerprint sensing chip has a top surface and a bottom surface opposite thereto, with the fingerprint sensing chip being disposed on the first surface with the bottom surface projecting towards the first surface. The fingerprint sensing chip includes a drive transmission pad, which is disposed on the top surface of the fingerprint sensing chip. The packaging layer covers the top surface of the fingerprint sensing chip and the first surface of the first dielectric layer. The packaging layer defines a first via hole, which is located in correspondence to the drive transmission pad of the fingerprint sensing chip. The first redistribution layer is disposed on the packaging layer, and the first distribution layer is connected electrically to the drive transmission pad via the first via hole of the packaging layer. The second dielectric layer covers the packaging layer and the first redistribution layer, along with defining a second via hole. The second redistribution layer is disposed on the second dielectric layer, with the second redistribution layer defining a looped pattern, while connecting electrically to the first redistribution layer via the second via hole of the second dielectric layer. The third dielectric layer covers the second dielectric layer and second redistribution layer.

In one configuration of the fingerprint identification device, the fingerprint sensing chip outputs a drive signal via the drive transmission pad, and the drive signal is transmitted to the second redistribution layer via the first redistribution layer.

In one configuration of the fingerprint identification device, the first dielectric layer includes a bonding pad therein, which is partially exposed from the first surface of the first dielectric layer. The fingerprint sensing chip further includes a signal transmission pad, which is disposed on the top surface of the fingerprint sensing chip. The packaging layer further defines a first thru hole and a second thru hole, with the first thru hole being located according to the signal transmission pad of the fingerprint sensing chip and the second thru hole being located according to the partially exposed bonding pad. The first redistribution layer contacts the signal transmission pad and the bonding pad via the first thru hole and second thru hole, respectively.

In one configuration of the fingerprint identification device, the fingerprint sensing chip further includes a sensing transmission pad, which is disposed on the top surface of the fingerprint sensing chip. The packaging layer further defines a third via hole that is located in accordance to the sensing transmission pad. The first redistribution layer defines a first transmission region and a second transmission region, with the first transmission region connecting electrically to the drive transmission pad of the fingerprint sensing chip via the first via hole of the packaging layer, while the second transmission region is connected electrically to the sensing transmission pad of the fingerprint sensing chip via the third via hole of the packaging layer. The second dielectric layer further defines a fourth via hole, while the second redistribution layer defines a sensing electrode region and an anti-static region. The sensing electrode region is connected electrically to the second transmission region of the first redistribution layer via the fourth via hole of the second dielectric layer, while the anti-static region is connected electrically to the first transmission region of the first redistribution layer via the second via hole of the second dielectric layer, with the looped pattern of the second redistribution layer being the anti-static region.

In one configuration of the fingerprint identification device, the fingerprint sensing chip outputs a sensing signal via the sensing transmission pad, with the sensing signal being transmitted to the sensing electrode region of the second redistribution layer via the first redistribution layer.

In one configuration of the fingerprint identification device, the anti-static region of the second redistribution layer is connected electrically to a ground via the drive transmission pad of the fingerprint sensing chip.

In one configuration of the fingerprint identification device, the first dielectric layer includes a bonding pad that is arranged therein, with the bonding pad partially exposed from the first surface of the first dielectric layer. The packaging layer further defines a third thru hole corresponding to the bonding pad partially exposed from the first dielectric layer. The first transmission region of the first redistribution layer is connected electrically to the bonding pad of the first dielectric layer via the third thru hole of the packaging layer.

In one configuration of the fingerprint identification device, the looped pattern of the second redistribution layer is exposed from the third dielectric layer.

In one configuration of the fingerprint identification device, the device further comprises a covering layer disposed on the third dielectric layer.

Based on the above, according to the fingerprint identification device of one embodiment of the instant disclosure, after the fingerprint sensing chip-equipped wafer has been manufactured, the extra conventional metal ring of the fingerprint identification device may be replaced by at least one RDL during the WLP process. Based on the characteristics associated with the WLP process, multiple fingerprint identification devices each without the extra metal ring could be manufactured simultaneously. Thus, the manufacturing process can be simplified and the overall manufacturing cost could be reduced. In addition, for the fingerprint identification device of one embodiment of the instant disclosure, at least one RDL of the WLP process is used to define an electrode sensing region, thus no sensing electrode is needed in the fingerprint sensing chip. Thus, the surface area of the fingerprint sensing chip can be greatly reduced along with lowering the overall manufacturing cost.

The embodiments hereinafter provide detailed description of the characteristics and advantages of the instant disclosure, with the description allowing a person skilled in the art to understand the technical features of the instant disclosure for practice. Additionally, based on the disclosed description, claims, and drawings, any person skilled in the art may easily understand the related purposes and advantages of the instant disclosure.

DETAILED DESCRIPTION

Please note that for all figures of the instant disclosure, for the purposes of illustration and description, the ratios among the elements may be different from that of the actual elements. Consequently, the figures are for reference only and should not be used for limiting the instant disclosure.

The description below is for a fingerprint identification device utilizing WLP such as the integrated fan-out (InFO) WLP for one embodiment of the instant disclosure.

Figure 1:
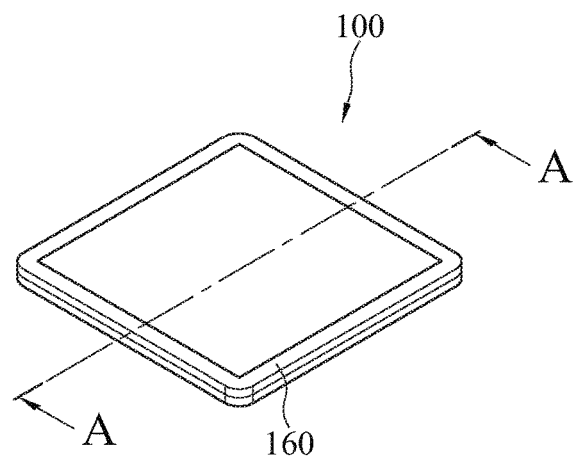
FIG. 1 is a perspective view of a fingerprint identification device for a first embodiment of the instant disclosure.
Figure 2:
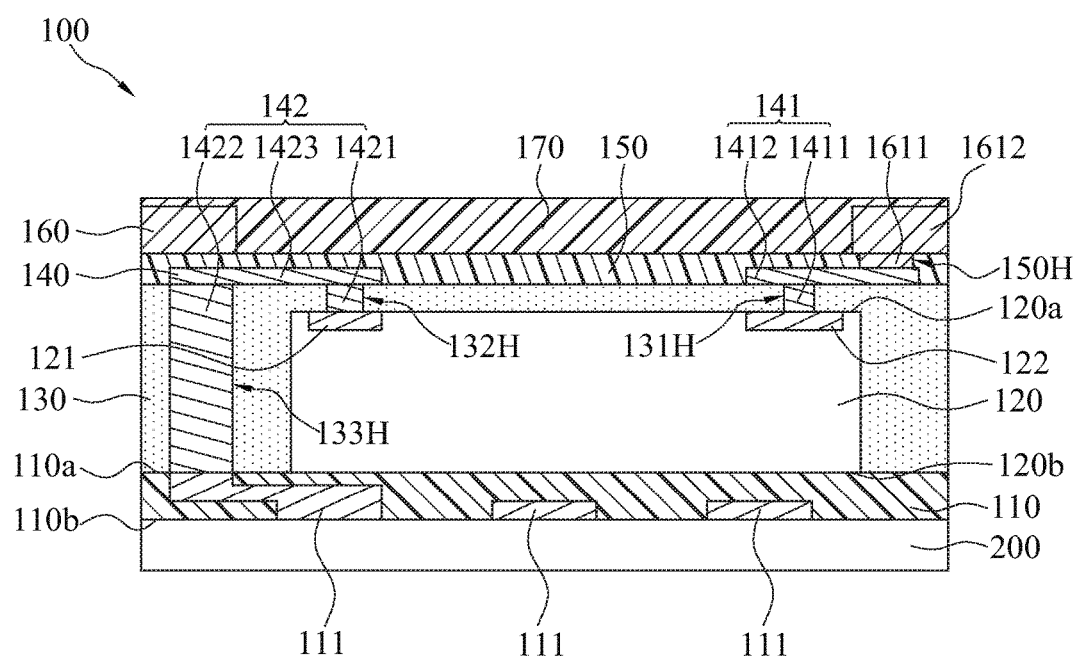
FIG. 2 is a sectional view along line A-A of FIG. 1.

FIG. 1 is a perspective view of a fingerprint identification device for a first embodiment of the instant disclosure, while FIG. 2 is a sectional view along line A-A of FIG. 1. Please refer to FIGS. 1 and 2, which show a fingerprint identification device 100 individualized from the WLP. The fingerprint identification device 100 for the first embodiment of the instant disclosure comprises a first dielectric layer 110, a fingerprint sensing chip 120, a packaging layer 130, a first redistribution layer (RDL) 140, a second dielectric layer 150, a second redistribution layer (RDL) 160, and a third dielectric layer 170.

The first dielectric layer 110 has a first surface 110a and a second surface 110b opposite thereto. In one configuration, the first dielectric layer 110 can be made of polymer such as epoxy, polyimide, etc. Alternatively, the first dielectric layer 110 can also be made of common dielectric materials such as spin-on glass coating, silicon oxide, silicon nitric oxide, etc. These materials provide anti-wear, anti-electrostatic discharge damage, water vapor diffusion resistance, or impact resistance capabilities, in order to protect the fingerprint sensing chip 120 disposed on the first dielectric layer 110.

For the instant embodiment, the first dielectric layer 110 can be formed on a base plate 200 by physical vapor deposition (PVD) or chemical vapor deposition (CVD) technique. The base plate 200 provides temporary mechanical and structural support, and can be furnished with at least one bonding pad 111 according to the design needs. Consequently, the first dielectric layer 110 can be formed on the base plate 200 and cover the bonding pad 111.

Additionally, the base plate 200 can have an adhesive layer, which can be any appropriate adhesive material such as ultraviolet (UV) adhesive. When exposed to ultraviolet light, it loses its adhesiveness such that the base plate 200 can be removed after the manufacturing process of the fingerprint identification device 100 is completed. In one configuration, the base plate 200 can be made of glass, aluminum oxide, silicon oxide, or any combination of the above.

In addition, the first dielectric layer 110 can utilize planarization technique such as chemical-mechanical polishing or horizontal cutting to remove residual portions. Thus, the first surface 110a of the first dielectric layer 110 can be smoother while exposing a portion of the bonding pad surface.

The fingerprint sensing chip 120 is disposed on the first dielectric layer 110 and has a top surface 120a and a bottom surface 120b opposite thereto. Thus, the fingerprint sensing chip 120 is disposed on the first dielectric layer 110 with the bottom surface 120b facing the first surface 110a.

In one configuration, the bottom surface 120b of the fingerprint sensing chip 120 is adhered by a die-attach film (DAF) or other suitable adhesive matter, prior to be disposed on the first dielectric layer 110.

It should be noted that for the purpose of explanation, FIG. 2 only illustrates one fingerprint sensing chip 120, but the instant disclosure is not restricted thereto. That is to say multiple fingerprint sensing chips 120 may be disposed on the first dielectric layer 110 simultaneously. Thus, after the fabrication process is completed, cutting is done to obtain multiple individual fingerprint identification devices 100.

The fingerprint sensing chip 120 may include a plurality of signal transmission pads 121, which are disposed on the top surface 120a thereof. For the first embodiment of the instant disclosure, the fingerprint sensing chip 120 utilizes active capacitive fingerprint identification technique. Therefore, at least one of the signal transmission pads 121 is a drive transmission pad 122, which transmits the drive signal generated by the internal circuit of the fingerprint sensing chip 120 externally, in order to achieve the capability of fingerprint identification according to the outputted drive signal. The drive signal may be a pulse wave signal.

It should be noted that for the purpose of explanation, FIG. 2 only illustrates one signal transmission pad 121 and one drive transmission pad 122; however the instant disclosure is not restricted thereto.

The packaging layer 130 covers the top surface 120a of the fingerprint sensing chip 120 and the first surface 110a of the first dielectric layer 110. The packaging layer 130 can be made of epoxy molding compounds (EMC), phenolic resins, silicone resins, etc. Thus, the fingerprint sensing chip 120 can be fixed and encapsulated on top of the first dielectric layer 110. Additionally, the packaging layer 130 provides protection against water vapor or static electricity intrusion to prevent damaging the fingerprint sensing chip 120.

The first RDL 140 can be disposed on the packaging layer 130 according to the traces of the fingerprint identification device 100.

For the instant embodiment, the aforementioned packaging layer 130 defines a first via hole 131H at a location corresponding to the drive transmission pad 122 of the fingerprint sensing chip 120. Thus, the corresponding traces of the first RDL 140 can make contact with the drive transmission pad 122 of the fingerprint sensing chip 120 via the first via hole 131H, in order to connect electrically with the drive transmission pad 122 for transmitting the drive signal generated by the fingerprint sensing chip 120.

The packaging layer 130 can further define a first thru hole 132H at a location corresponding to the signal transmission pad 121 of the fingerprint sensing chip 120. Consequently, the corresponding traces of the first RDL 140 can contact the signal transmission pad 121 of the fingerprint sensing chip 120 via the first thru hole 132H. In addition, the packaging layer 130 also defines a second thru hole 133H at a location corresponding to the bonding pad 111 exposed from the first surface 110a. Thus, the traces of the first RDL 140 in contact with the signal transmission pad 121 can make contact with the bonding pad 111 via the second thru hole 133H. The above allows the signal transmission pad 121 to connect electrically with the bonding pad 111 for transmitting signals.

The material of the first RDL 140 may be a metal such as copper, silver, aluminum, nickel, or any combination of the above.

In one embodiment, the first RDL 140 defines at least two transmission regions. The following configuration is based on two transmission regions, which will be called a first transmission region 141 and a second transmission region 142. The first transmission region 141 includes a metal column 1411 and a trace 1412, while the second transmission region 142 includes two metal columns 1421 and 1422 and the trace 1423.

For the above embodiment, prior to disposing the fingerprint sensing chip 120 on the first dielectric layer 110, the metal column 1422 can be formed on the partially exposed surface of the bonding pad 111. For example, a patterned mask (not shown), is formed on the first dielectric layer 110 to define the shape and location of the would-be metal column 1422. Then, electrolysis or a deposition technique is utilized to form the metal column 1422 at the location defined by the patterned mask. After the metal column 1422 is formed, a stripping process is performed to remove the patterned mask in order to isolate the metal column 1422. The patterned mask can be a photoresist.

After the fingerprint sensing chip 120 has been disposed on the first dielectric layer 110, the metal columns 1411 and 1421 can be formed on the drive transmission pad 122 and signal transmission pad 121, respectively, of the fingerprint sensing chip 120.

The first dielectric layer 110 and fingerprint sensing chip 120 are covered by the packaging layer 130. The top surface of the packaging layer 130 can surpass or flush with the upper surfaces of the metal columns 1411, 1421, and 1422. When the top surface of the packaging layer 130 surpasses the upper surfaces of the metal columns 1411, 1421, and 1422, a thinning process such as polishing or etching may be utilized to reduce the height of the packaging layer 130, until the upper surface of the metal column 1411 is exposed from the top surface of the packaging layer 130.

After the upper surfaces of the metal columns 1411, 1421, and 1422 have been exposed, the traces 1412 and 1423 of the first RDL 140 can be disposed onto the packaging layer 130, according to the trace layout of the fingerprint identification device 100. The trace 1412 of the first RDL 140 may contact the metal column 1411 exposing from the top surface of the packaging layer 130, while the trace 1423 of the first RDL 140 may contact the metal columns 1421 and 1422 exposing from the top surface of the packaging layer 130.

The second dielectric layer 150 covers the first RDL 140 for the protection purpose. The material composition of the second dielectric layer 150 is approximately the same as that of the first dielectric layer 110, therefore no further details are provided hereinwith.

The second RDL 160 is disposed on the second dielectric layer 150, which can define a second via hole 150H at a location corresponding to the trace of the first RDL 140, such that the trace of the second RDL 160 can contact the first transmission region 141 via the second via hole 150H, so the first RDL 140 can be electrically connected to the drive transmission pad 122 for transmitting the drive signal generated by the fingerprint sensing chip 120. The material composition of the second RDL 160 is approximately the same as that of the first RDL 140.

In one configuration, the second RDL 160 includes a metal column 1611 and a trace 1612. For the instant configuration, the metal column 1611 can be disposed at a predetermined location within the first transmission region 141 prior to forming the second dielectric layer 150, according to the trace layout of the fingerprint identification device 100. Consequently, the metal column 1611 acts as a bridge for electrical connection between the first and second RDLs 140 and 160.

Next, the second dielectric layer 150 is formed to cover the first RDL 140. Thus, the top surface of the second dielectric layer 150 may surpass or flush to the upper surface of the metal column 1611. When the top surface of the second dielectric layer 150 surpasses the upper surface of the metal column 1611, a thinning process such as polishing or etching may be utilized to reduce the height of the second dielectric layer 150, until the upper surface of the metal column 1611 is exposed from the top surface of the second dielectric layer 150.

After the upper surface of the metal column 1611 has been exposed, the trace 1612 of the second RDL 160 can be disposed onto the second dielectric layer 150, according to the trace layout of the fingerprint identification device 100, with the trace 1612 contacting the metal column 1611.

For the instant embodiment, the second RDL 160 is used for replacing the conventional extra metal frame. Therefore, the trace 1612 of the second RDL 160 can form a looped pattern that is rectangular or circular shaped. Furthermore, the looped pattern can be non-closed such as C- or U-shaped. Further still, the trace 1612 of the second RDL 160 in forming this looped pattern can be non-continuous, such as divided into four discrete strips arranged in a rectangular-shaped pattern. These discrete traces 1612 are electrically connected to the first transmission region 141 of the first RDL 140 via the respective second via holes 150H of the second dielectric layer 150, in order to transmit the drive signals generated by the fingerprint sensing chip 120.

The third dielectric layer 170 covers the second dielectric layer 150. For the instant embodiment, the third dielectric layer 170 can protect the second dielectric layer 150 and the second RDL 160 by covering these elements underneath.

Figure 3:
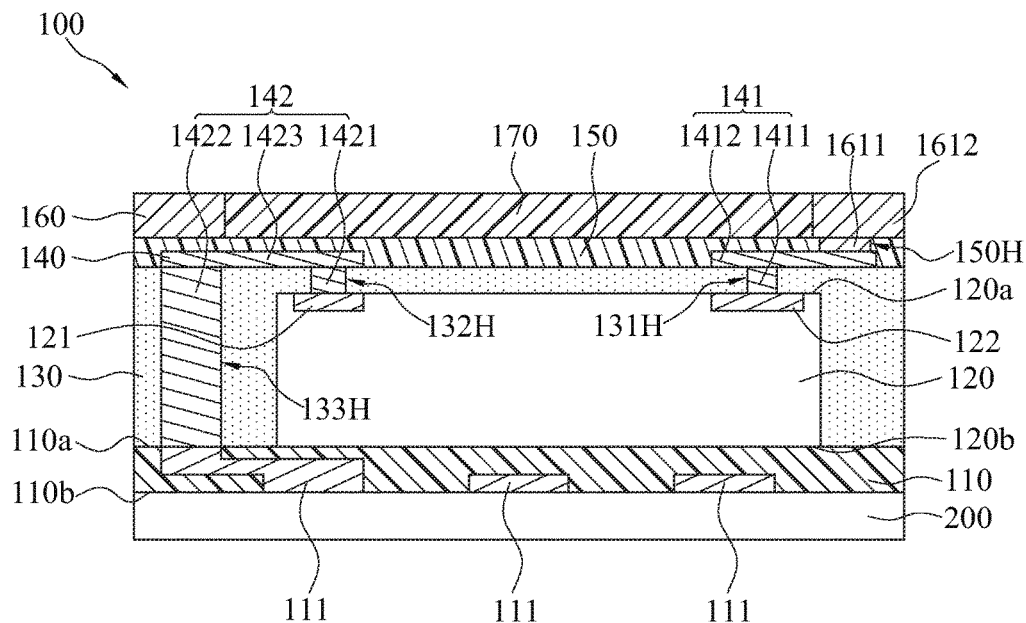
FIG. 3 is a sectional view for one configuration of the fingerprint identification device for the first embodiment of the instant disclosure.

However, the instant disclosure is not restricted thereto. In one configuration of the instant embodiment, the third dielectric layer 170 covers the second dielectric layer 150 while exposing the looped pattern of the second RDL 160, such that the fingerprint sensing chip 120 can reduce the strength of the drive signal it generates. Thus, the overall power consumption of the fingerprint identification device 100 can be reduced. Therefore, the third dielectric layer 170 can fill up the empty space between adjacent traces of the second RDL 160. Consequently, the fingerprint identification device 100 can have a flat and smooth appearance as shown in FIG. 3.

For the instant embodiment, the third dielectric layer 170 can be made of the same material as that of the first dielectric layer 110. In addition, the third dielectric layer 170 can further provide a colored outer appearance. In such a way, after the fingerprint identification device 100 is paired to the electronic device, the overall outer appearance and color scheme of the electronic device can be matched up with.

Nevertheless, the instant disclosure is not restricted thereto. Depending on the design requirements, the color scheme of the outer appearance of the third dielectric layer 170 may also not match that of the electronic device.

In one configuration, when the third dielectric layer 170 is formed on the second dielectric layer 150, the top surface of the third dielectric layer 170 may surpass or flush with the upper surface of the trace 1612 of the second RDL 160. When the top surface of the third dielectric layer 170 surpasses the upper surface of the trace 1612 of the second RDL 160, a thinning process such as polishing or etching may be utilized to reduce the height of the third dielectric layer 170. The thinning process can be performed until the upper surface of the trace 1612 of the second RDL 160 is exposed from the top surface of the third dielectric layer 170.

Figure 4:
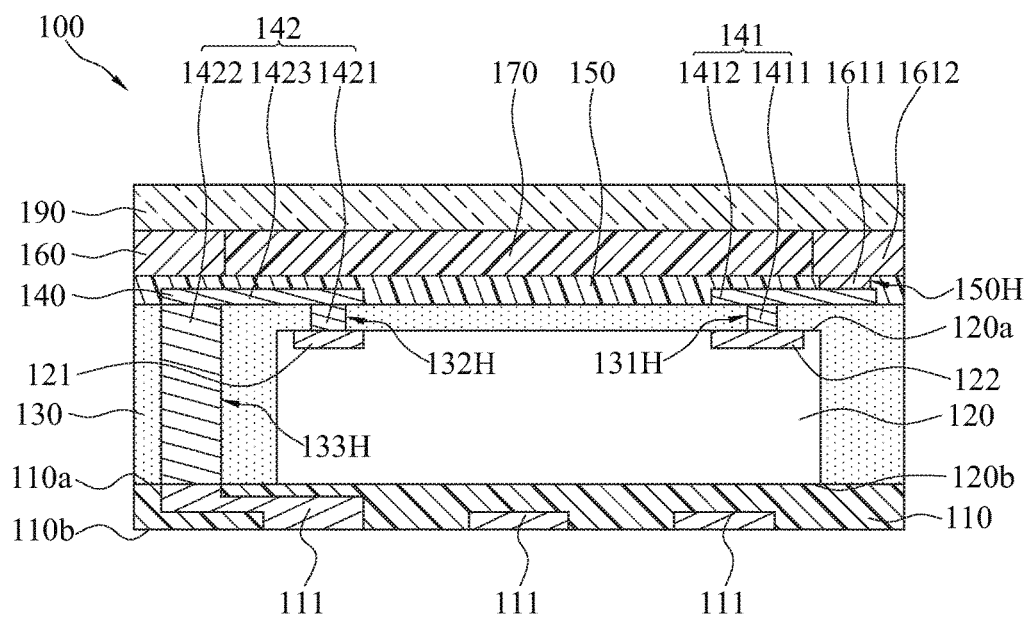
FIG. 4 is a sectional view of the fingerprint identification device for a second embodiment of the instant disclosure.

FIG. 4 is a sectional view of the fingerprint identification device for a second embodiment of the instant disclosure. In referring to FIG. 4 of the second embodiment, the fingerprint identification device 100 further comprises a covering layer 190 covering the third dielectric layer 170. The covering layer 190 may be light-permitting such as glass, sapphire, etc. However, the instant disclosure is not restricted thereto. The covering layer 190 may also be non-light permitting such as a coating. This coating can provide a color scheme for the outer appearance, such that when the fingerprint identification device 100 is paired to the electronic device, the overall outer appearance and color scheme of the electronic device can be matched up with.

Figure 5:
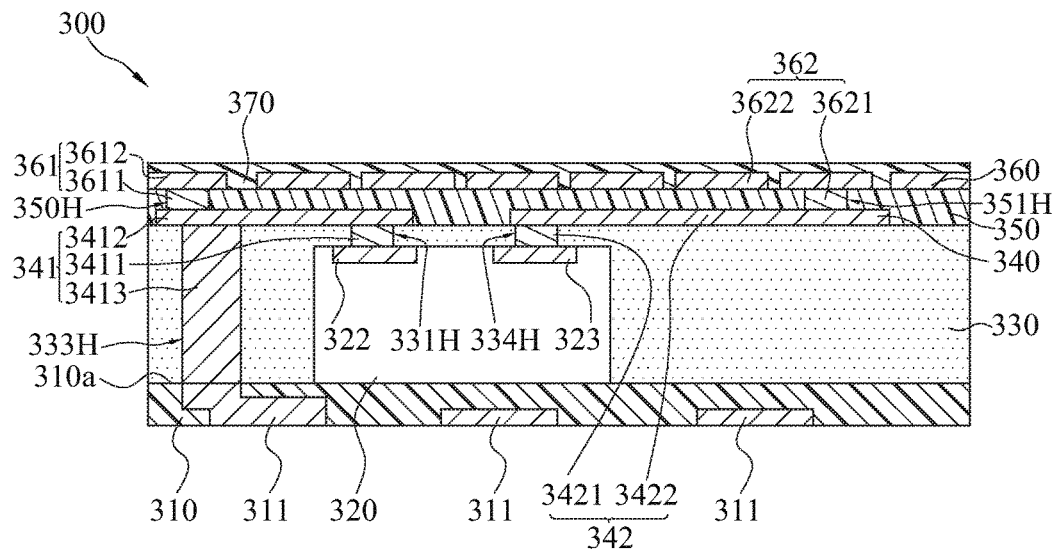
FIG. 5 is a sectional view of the fingerprint identification device for a third embodiment of the instant disclosure.

FIG. 5 is a sectional view of the fingerprint identification device for a third embodiment of the instant disclosure. In referring to FIG. 5, a fingerprint identification device 300 of the third embodiment comprises a first dielectric layer 310, a fingerprint sensing chip 320, a packaging layer 330, a first RDL 340, a second dielectric layer 350, a second RDL 360, and a third dielectric layer 370.

For the above embodiment, the first dielectric layer 310 is approximately the same as the first dielectric layer 110 in the first embodiment, therefore no further details are provided herein.

The fingerprint sensing chip 320 is disposed on the first dielectric layer 310 and has a top surface and a bottom surface opposite thereto. By projecting its bottom surface towards a first surface 310a of the first dielectric layer 310, the fingerprint sensing chip 320 is disposed on the first dielectric layer 310.

For the instant embodiment, since the sensing electrodes of conventional fingerprint sensing chip are to be replaced by the RDL of the wafer-class packaging technique, the fingerprint sensing chip 320 does not need to accommodate sensing electrodes of a large surface area, so the surface area of the fingerprint sensing chip 320 can be greatly reduced.

For the instant embodiment, the fingerprint sensing chip 320 includes a plurality of signal transmission pads, which are disposed on the top surface thereof. The fingerprint sensing chip 320 utilizes a passive capacitive type fingerprint identification technique. Therefore, at least one of the signal transmission pads of the fingerprint sensing chip 320 is a sensing transmission pad 323. Consequently, the sensing signal required by the internal circuit of the fingerprint sensing chip 320 can be generated by the sensing electrode, which is formed by the outer RDL, in order to achieve fingerprint identification capability.

Additionally, the fingerprint sensing chip 320 includes a drive transmission pad 322. For the instant embodiment, the drive transmission pad 322 is electrically connected to a ground, so that the second RDL 360 connected to the drive transmission pad 322 can be protected against static electricity.

It should be noted that to better understand the trace between the sensing transmission pad 323 and drive transmission pad 322, FIG. 5 only illustrates one sensing transmission pad 323 and one drive transmission pad 322, without showing other signal transmission pads. Meanwhile, for the trace connection of the signal transmission pads, please refer to the previously mentioned first embodiment (or second embodiment), and FIG. 2, with no further details provided herein.

The packaging layer 330 covers the fingerprint sensing chip 320 and first surface 310a of the first dielectric layer 310, such that the fingerprint sensing chip 320 is secured and packaged onto the first dielectric layer 310.

According to the trace layout required by the fingerprint identification device 300, the first RDL 340 can be disposed on the packaging layer 330.

For the instant embodiment, the packaging layer 330 defines a first via hole 331H at a location corresponding to the drive transmission pad 322 of the fingerprint sensing chip 320. Thus, the corresponding trace of the first RDL 340 can contact the drive transmission pad 322 of the fingerprint sensing chip 320 via the first via hole 331H, in order to connect electrically to a ground via the drive transmission pad 322.

In one configuration, the packaging layer 330 further defines a third thru hole 333H at the location of a bonding pad 311. Consequently, the corresponding trace of the first RDL 340 contacting the drive transmission pad 322 of the fingerprint sensing chip 320 can contact the bonding pad 311, which is exposed from the first surface 310a of the first dielectric layer 310, via the third thru hole 333H. The bonding pad 311 can be electrically connected to a ground.

Additionally, the packaging layer 330 can define a third via hole 334H at a location corresponding to the sensing transmission pad 323 of the fingerprint sensing chip 320, in order to allow the corresponding trace of the first RDL 340 to contact the sensing transmission pad 323 of the fingerprint sensing chip 320 via the third via hole 334H.

In one configuration of the instant embodiment, the first RDL 340 defines at least two transmission regions, which will be called a first transmission region 341 and a second transmission region 342. The first transmission region 341 includes a pair of metal columns 3411 and 3413 and a trace 3412, while the second transmission region 342 includes a metal column 3421 and a trace 3422.

For the instant configuration, the metal column 3413 of the first transmission region 341 may be formed on the partially exposed surface of the bonding pad 311, prior to disposing the fingerprint sensing chip 320 on the first dielectric layer 310. Next, after the fingerprint sensing chip 320 is disposed on the first dielectric layer 310, the metal columns 3411 and 3421 can be formed on the drive transmission pad 322 and sensing transmission pad 323, respectively, of the fingerprint sensing chip 320.

The first dielectric layer 310 and fingerprint sensing chip 320 are covered by the packaging layer 330. The top surface of the packaging layer 330 can surpass or flush with the upper surfaces of the metal columns 3411 and 3413. When the top surface of the packaging layer 330 surpasses the upper surfaces of the metal columns 3411 and 3413, a thinning process such as polishing or etching may be utilized to reduce the height of the packaging layer 330, until the upper surfaces of the metal columns 3411 and 3413 are exposed from the top surface of the packaging layer 330.

Then, according to the trace layout of the fingerprint identification device 300, each of the traces of the first RDL 340 can be disposed on the packaging layer 330. Specifically, the trace 3412 of the first RDL 340 can contact the metal columns 3411 and 3413 exposed from the top surface of the packaging layer 330. Meanwhile, the trace 3422 of the first RDL 340 may contact the metal column 3421 exposed from the top surface of the packaging layer 330.

To protect the first RDL 340, the second dielectric layer 350 covers the first RDL 340.

The second RDL 360 is disposed on the second dielectric layer 350, which defines a second via hole 350H at a location corresponding to the trace 3412 of the first RDL 340, such that the corresponding trace of the second RDL 360 can contact the first transmission region 341 of the first RDL 340 via the second via hole 350H. Additionally, the second dielectric layer 350 defines a fourth via hole 351H, which corresponds to the trace 3422 of the first RDL 340, to allow the corresponding trace of the second RDL 360 in contacting the second transmission region 342 of the first RDL 340 via the fourth via hole 351H.

The material composition of the second RDL 360 is approximately the same as that of the first RDL 340.

For the instant embodiment, the second RDL 360 may define an anti-static region 361 and a sensing electrode region 362. The sensing electrode region 362 of the second RDL 360 has a plurality of sensing electrodes, for replacing conventional sensing electrodes of fingerprint sensing chip.

The anti-static region 361 includes a metal column 3611 and a trace 3612, while the sensing electrode region 362 includes a metal column 3621 and a trace 3622. The trace 3622 of the sensing electrode region 362 is used for forming the sensing electrodes.

For the instant embodiment, according to the trace layout of the fingerprint identification device 300, the metal column 3611 of the anti-static region 361 can be disposed at a pre-determined location within the first transmission region 341 of the first RDL 340, prior to forming the second dielectric layer 350. Thus, the metal column 3611 serves as a bridge for electrical connection between the first and second RDLs 340 and 360.

Likewise, according to the trace layout of the fingerprint identification device 300, the metal column 3621 of the sensing electrode region 362 can be disposed at a pre-determined location within the second transmission region 342 of the first RDL 340, prior to forming the second dielectric layer 350.

The second dielectric layer 350 covers the first RDL 340. The top surface of the second dielectric layer 350 can surpass or flush with the upper surfaces of the metal columns 3611 and 3621. When the top surface of the second dielectric layer 350 surpasses the upper surfaces of the metal columns 3611 and 3621, a thinning process such as polishing or etching may be utilized to reduce the height of the second dielectric layer 350, until the upper surfaces of the metal columns 3611 and 3621 are exposed from the top surface of the second dielectric layer 350.

Then, according to the trace layout of the fingerprint identification device 300, traces 3612 and 3622 of the second RDL 360 can be disposed on the second dielectric layer 350. Specifically, the trace 3612 of the second RDL 360 can contact the metal column 3611 exposed from the top surface of the second dielectric layer 350, while trace 3622 of the second RDL 360 may contact the metal column 3621 exposed from the top surface of the second dielectric layer 350.

For the instant embodiment, the anti-static region 361 of the second RDL 360 may surround the sensing electrode region 362 therewithin. Therefore, the trace 3612 of the second RDL 360 can form a looped pattern that is rectangular or circular shaped. Additionally, the looped pattern can be non-closed such as C- or U-shaped. Further still, the trace 3612 of the second RDL 360 in forming this looped pattern can be non-continuous, such as divided into four discrete strips arranged in a rectangular-shaped pattern. These discrete traces 3612 are connected to the first transmission region 341 of the first RDL 340 via respective second via holes 350H of the second dielectric layer 350, in order to connect electrically to the ground.

The third dielectric layer 370 covers the second dielectric layer 350. For the instant embodiment, the third dielectric layer 370 can cover both the second dielectric layer 350 and second RDL 360 for protective purposes.

For the instant embodiment, the third dielectric layer 370 can provide a colored outer appearance. In such a way, after the fingerprint identification device 300 is paired to the electronic device, the overall outer appearance and color scheme of the electronic device can be matched up with. Nevertheless, the instant disclosure is not restricted thereto. Depending on the design requirements, the color scheme of the outer appearance of the third dielectric layer 370 may also not match that of the electronic device.

In one configuration, the third dielectric layer 370 is formed on the second dielectric layer 350, where the top surface of the third dielectric layer 370 may surpass the top surface of the second RDL 360 in height. A thinning process such as polishing or etching may be utilized to reduce the height of the third dielectric layer 370 for flattening its surface as shown in FIG. 5.

Figure 6:
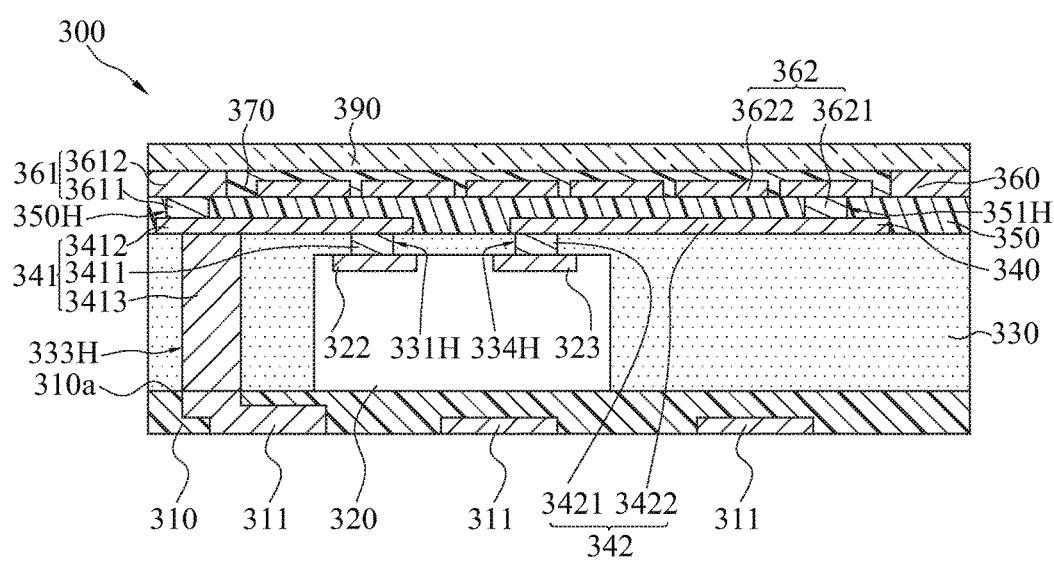
FIG. 6 is a sectional view of the fingerprint identification device for a fourth embodiment of the instant disclosure.

FIG. 6 is a sectional view of the fingerprint identification device for a fourth embodiment of the instant disclosure. Please refer to FIG. 6 of the fourth embodiment, in which the fingerprint identification device 300 further comprises a covering layer 390 covering the third dielectric layer 370. The covering layer 390 may be light-permitting such as glass, sapphire, etc. However, the instant disclosure is not restricted thereto. The covering layer 390 may also be non-light permitting such as a coating. This coating can provide a color scheme for the outer appearance, such that when the fingerprint identification device 300 is paired to the electronic device, the overall outer appearance and color scheme of the electronic device can be matched up with.

It should be noted that for the third embodiment (or fourth embodiment), of the instant disclosure, the fingerprint identification device 300 typically requires multiple sensing electrodes to obtain fingerprint information of the user. However, the more sensing electrodes required by the fingerprint identification device 300, the more crowded are the traces of the sensing electrode region 362, which is difficult to be achieved by a single distribution layer. Therefore, for one configuration of the third embodiment (or fourth embodiment), of the instant disclosure, at least one third RDL and at least one fourth dielectric layer are included, in order for the crowded traces of the sensing electrode region 362 of the fingerprint identification device 300 to be laid out via the third RDL. The third RDL may be disposed on the second dielectric layer 350, while being in between the second dielectric layer 350 and the second RDL 360. Meanwhile, the fourth dielectric layer may be disposed on the second dielectric layer 350 for covering the third RDL, while being in between the second dielectric layer 350 and third dielectric layer 390.

Based on the above, according to the fingerprint identification device of one embodiment of the instant disclosure, after the fingerprint sensing chip-equipped wafer has been manufactured, the extra conventional metal ring of the fingerprint identification device may be replaced by at least one RDL during the WLP process. Based on the characteristics associated with the WLP process, multiple fingerprint identification devices each without the extra metal ring could be manufactured simultaneously. Thus, the manufacturing process can be simplified and the overall manufacturing cost could be reduced. In addition, for the fingerprint identification device of one embodiment of the instant disclosure, at least one RDL of the WLP process is used to define an electrode sensing region, thus no sensing electrode is needed in the fingerprint sensing chip. Thus, the surface area of the fingerprint sensing chip can be greatly reduced along with lowering the overall manufacturing cost.

While the instant disclosure has been described by way of example and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. A fingerprint identification device, comprising:
a first dielectric layer having a first surface and a second surface opposite thereto;
a fingerprint sensing chip having a top surface and a bottom surface opposite thereto, the fingerprint sensing chip being disposed on the first surface with the bottom surface projecting towards the first surface, the fingerprint sensing chip including a drive transmission pad, the drive transmission pad being disposed on the top surface;
a packaging layer covering the top surface of the fingerprint sensing chip and the first surface of the first dielectric layer, the packaging layer defining a first via hole, the first via hole being corresponding to the drive transmission pad;
a first redistribution layer disposing on the packaging layer, the first distribution layer connecting electrically to the drive transmission pad via the first via hole;
a second dielectric layer covering the packaging layer and the first redistribution layer, the second dielectric layer defining a second via hole;
a second redistribution layer disposing on the second dielectric layer, the second redistribution layer defining a looped pattern, while connecting electrically to the first redistribution layer via the second via hole; and
a third dielectric layer covering the second dielectric layer and second redistribution layer.

2. The fingerprint identification device of claim 1, wherein the looped pattern of the second redistribution layer is exposed from the third dielectric layer.

3. The fingerprint identification device of claim 2, further comprising a covering layer disposed on the third dielectric layer.

4. The fingerprint identification device of claim 1, wherein the fingerprint sensing chip outputs a drive signal via the drive transmission pad, and the drive signal is transmitted to the second redistribution layer via the first redistribution layer.

5. The fingerprint identification device of claim 4, wherein the looped pattern of the second redistribution layer is exposed from the third dielectric layer.

6. The fingerprint identification device of claim 5, further comprising a covering layer disposed on the third dielectric layer.

7. The fingerprint identification device of claim 1, wherein the first dielectric layer includes a bonding pad therein, with the bonding pad partially exposed from the first surface of the first dielectric layer, wherein the fingerprint sensing chip further includes a signal transmission pad, with the signal transmission pad being disposed on the top surface, wherein the packaging layer further defines a first thru hole and a second thru hole, with the first thru hole located according to the signal transmission pad and the second thru hole located according to the partially exposed bonding pad, and wherein the first redistribution layer contacts the signal transmission pad and the bonding pad by the first thru hole and second thru hole, respectively.

8. The fingerprint identification device of claim 7, wherein the looped pattern of the second redistribution layer is exposed from the third dielectric layer.

9. The fingerprint identification device of claim 8, further comprising a covering layer disposed on the third dielectric layer.

10. The fingerprint identification device of claim 1, wherein the fingerprint sensing chip further includes a sensing transmission pad disposed on the top surface, with the packaging layer further defines a third via hole that is located in accordance to the sensing transmission pad, wherein the first redistribution layer defines a first transmission region and a second transmission region, with the first transmission region connecting electrically to the drive transmission pad via the first via hole, while the second transmission region is connected electrically to the sensing transmission pad via the third via hole, wherein the second dielectric layer further defines a fourth via hole, while the second redistribution layer defines a sensing electrode region and an anti-static region, wherein the sensing electrode region is connected electrically to the second transmission region via the fourth via hole, while the anti-static region is connected electrically to the first transmission region via the second via hole, with the looped pattern being the anti-static region.

11. The fingerprint identification device of claim 10, further comprising a covering layer disposed on the third dielectric layer.

12. The fingerprint identification device of claim 10, wherein the fingerprint sensing chip inputs a sensing signal via the sensing transmission pad, with the sensing signal being transmitted to the first redistribution layer via the sensing electrode region of the second redistribution layer.

13. The fingerprint identification device of claim 12, further comprising a covering layer disposed on the third dielectric layer.

14. The fingerprint identification device of claim 10, wherein the anti-static region of the second redistribution layer is connected electrically to a ground via the drive transmission pad of the fingerprint sensing chip.

15. The fingerprint identification device of claim 14, further comprising a covering layer disposed on the third dielectric layer.

16. The fingerprint identification device of claim 10, wherein the first dielectric layer includes a bonding pad therein, with the bonding pad partially exposed from the first surface of the first dielectric layer, wherein the packaging layer further defines a third thru hole corresponding to the partially exposed bonding pad, and wherein the first transmission region of the first redistribution layer is connected electrically to the bonding pad via the third thru hole.

17. The fingerprint identification device of claim 16, further comprising a covering layer disposed on the third dielectric layer.

* * * * *